United States Patent
Park et al.

(10) Patent No.: US 10,644,253 B2
(45) Date of Patent: May 5, 2020

(54) ORGANIC LIGHT-EMITTING DIODE DISPLAY DEVICE

(71) Applicant: LG Display Co., Ltd, Seoul (KR)

(72) Inventors: Mi-Kyung Park, Paju-si (KR); Young-Wook Kim, Paju-si (KR); Ji-Su Han, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/135,424

(22) Filed: Sep. 19, 2018

(65) Prior Publication Data

US 2019/0103572 A1    Apr. 4, 2019

(30) Foreign Application Priority Data

Sep. 29, 2017 (KR) .................. 10-2017-0127127

(51) Int. Cl.
*H01L 51/50* (2006.01)
*H01L 51/52* (2006.01)
*H01L 27/32* (2006.01)

(52) U.S. Cl.
CPC ...... *H01L 51/5012* (2013.01); *H01L 27/3244* (2013.01); *H01L 27/3262* (2013.01); *H01L 51/5206* (2013.01); *H01L 51/5221* (2013.01); *H01L 51/5246* (2013.01); *H01L 51/5268* (2013.01); *H01L 51/5281* (2013.01); *H01L 27/322* (2013.01)

(58) Field of Classification Search
None
See application file for complete search history.

(56) References Cited

U.S. PATENT DOCUMENTS

| | | | |
|---|---|---|---|
| 2009/0153972 A1* | 6/2009 | Nakamura | H01L 51/5268 359/599 |
| 2017/0153668 A1* | 6/2017 | Jang | G06F 1/1641 |
| 2019/0025970 A1* | 1/2019 | Kim | G02F 1/133528 |
| 2019/0081274 A1* | 3/2019 | Choi | H01L 51/5253 |
| 2019/0155438 A1* | 5/2019 | Kim | G06F 3/0412 |

OTHER PUBLICATIONS

Seo et al. "Phase Morphology and Foaming of Polypropylene/Ethylene-octene Copolymer Blends", Polymer(Korea), vol. 25, No. 5, (2001), pp. 707-718.
Tsivintzelis et al. "Foaming of polymers with supercritical fluids: A thermodynamic investigation", J. of Supercritical Fluids, 110, (2016), p. 240-250.

* cited by examiner

*Primary Examiner* — Shaun M Campbell
(74) *Attorney, Agent, or Firm* — Birch, Stewart, Kolasch & Birch, LLP

(57) ABSTRACT

An organic light-emitting diode (OLED) display device includes a substrate; a light-emitting diode including a first electrode, an organic emitting layer and a second electrode and disposed on a first side of the substrate; and a foamed polymer layer disposed on a second side of the substrate and including a polymer resin and an air pocket inside the polymer resin.

13 Claims, 5 Drawing Sheets

ORGANIC LIGHT-EMITTING DIODE DISPLAY DEVICE

CROSS-REFERENCE TO RELATED APPLICATIONS

This application claims priority to and the benefit of Republic of Korean Patent Application No. 10-2017-0127127, filed on Sep. 29, 2017 in the Republic of Korea, in the Korean Intellectual Property Office, which is incorporated herein by reference in its entirety.

BACKGROUND

1. Technical Field

The present disclosure relates to an organic light-emitting diode display device, and more particularly, to an organic light-emitting diode display device having improved impact resistance.

2. Discussion of the Related Art

Recently, with the advent of an information-oriented society and as the interest in information displays for processing and displaying a massive amount of information and demand for portable information media have increased, a display field has been rapidly advanced. Thus, various light and thin flat panel display devices have been developed and highlighted.

As specific examples of the flat display devices, there are a liquid crystal display (LCD) device, a plasma display panel (PDP) device, a field emission display (FED) device, an electroluminescence display (ELD) device, an organic light-emitting diode (OLED) display device, and the like. The flat display devices exhibit excellent characteristics in terms of thinning, lightening, and reductions in the power consumption thereof and thus have rapidly replaced the conventional cathode ray tube (CRT) displays.

Among the flat panel display devices, the OLED display device is an emissive type device and does not require a separate backlight unit used in a non-emissive type device such as the LCD device. As a result, the OLED display device has light weight and a thin profile.

In addition, the OLED display device has advantages of a better viewing angle, an improved contrast ratio, and reduced power consumption as compared with the LCD device. Furthermore, the OLED display device can be driven with a low direct current (DC) voltage and has a rapid response speed. Moreover, since the inner elements of the OLED display device have a solid phase, the OLED display device has high durability against an external impact and has a wide available temperature range.

Specifically, since the OLED display device is manufactured through a simple process, manufacturing costs can be reduced as compared with the conventional LCD device.

FIG. 1 is a schematic cross-sectional view illustrating a related art OLED display device.

As shown in FIG. 1, in an OLED display device 10, a substrate 1, on which a driving thin film transistor DTr and a light-emitting diode 14 are formed, is encapsulated by an encapsulation substrate 2.

More specifically, the driving thin film transistor DTr is formed in each pixel region SP on an upper portion of the substrate 1. A first electrode 11 is connected to the driving thin film transistor DTr. An organic emitting layer 13 for emitting a specific color light is formed on an upper portion of the first electrode 11. A second electrode 15 is formed on an upper portion of the organic emitting layer 13.

The first and second electrodes 11 and 15 and the organic emitting layer 13 formed between the first electrode 11 and the second electrode 15 constitute the light-emitting diode (LED) 14. In this case, in the OLED display device 10, the first electrode 11 can serve as an anode, and the second electrode 15 can serve as a cathode.

Color filters for emitting red, green, blue, and white colors are provided in the pixel regions SP. White light from the organic emitting layer 13 passes through the color filters, and the pixel regions SP emit red, green, blue, and white colors.

The encapsulation substrate 2 in the form of a thin film is formed above the driving thin film transistor DTr and the light-emitting diode 14 so that the OLED display device 10 is encapsulated through the encapsulation substrate 2.

Recently, since a light and flexible material such as thin glass or plastic has been used as the substrate 1, the OLED display device 10 can maintain display performance despite being implemented to have a light weight and a thin profile or being bent like paper. Thus, the OLED display device 10 has risen rapidly as the next generation flat panel display.

However, the OLED display device 10 using the thin glass or plastic as the substrate 1 is vulnerable to an external impact such as a dropping impact.

In particular, the LED 14 can be damaged or an element such as the driving thin film transistor DTr can be broken by an impact transferred from the outside to cause a significant problem in reliability of the OLED display device 10 in the related art.

SUMMARY

Accordingly, an embodiment of the invention is directed to an OLED display device that substantially obviates one or more of the problems due to limitations and disadvantages of the related art, and has other advantages.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

Embodiments of the invention relate to an organic light-emitting diode display device including a substrate; a light-emitting diode including a first electrode, an organic emitting layer and a second electrode and disposed on a first side of the substrate; and a foamed polymer layer disposed on a second side of the substrate and including a polymer resin and an air pocket inside the polymer resin.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Reference will now be made in detail to embodiments of the invention, examples of which are illustrated in the accompanying drawings.

First Embodiment

Figure 1:
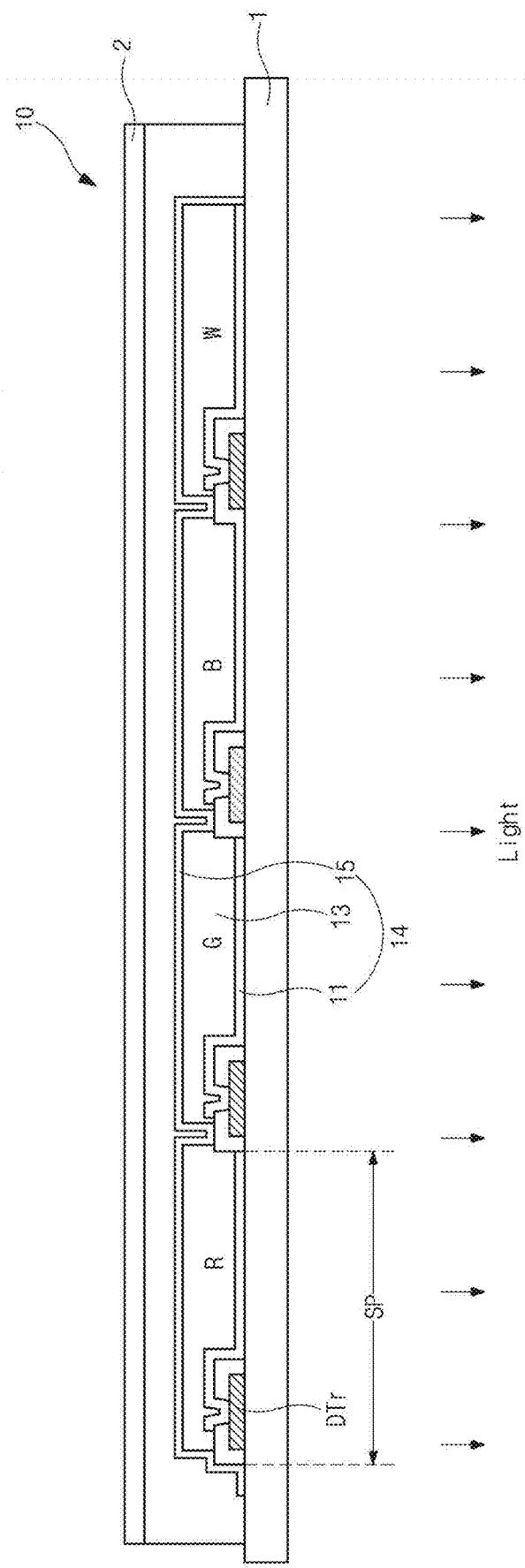
FIG. 1 is a schematic cross-sectional view illustrating a related art organic light-emitting diode (OLED) display device.
Figure 2:
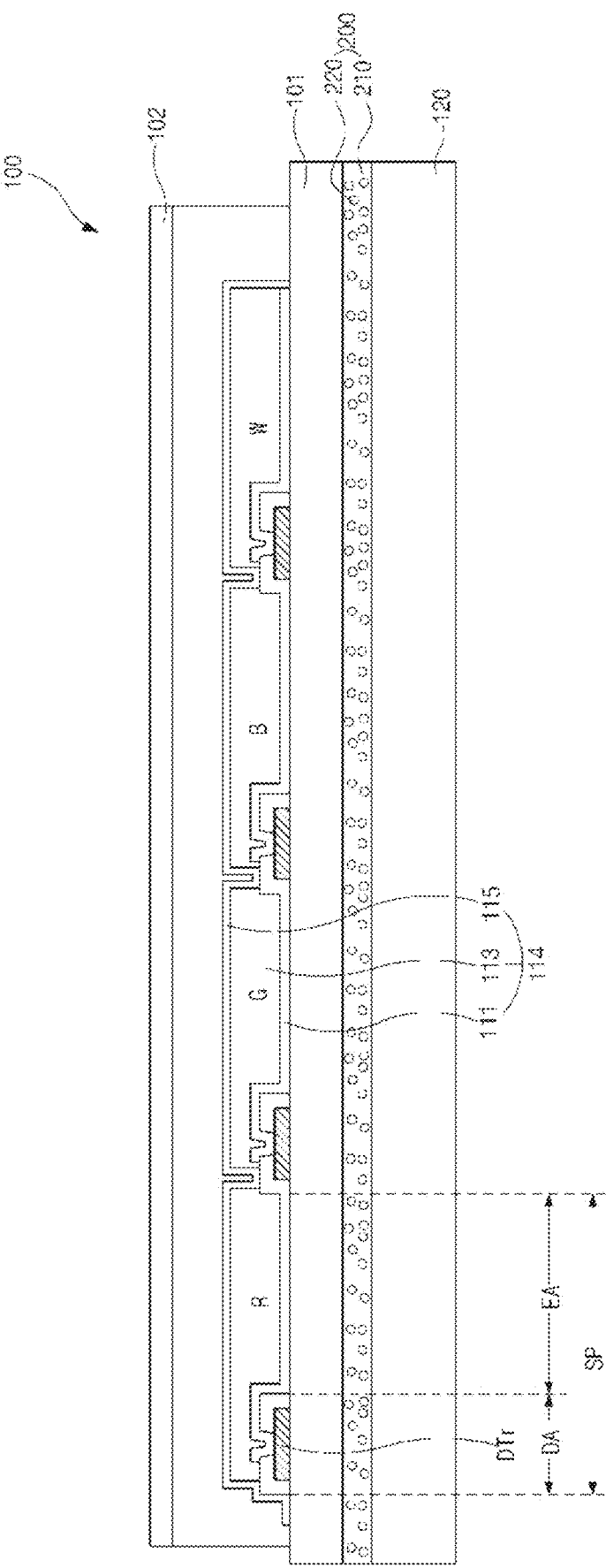
FIG. 2 is a schematic cross-sectional view illustrating an OLED display device according to a first embodiment of the present disclosure.
Figure 3:
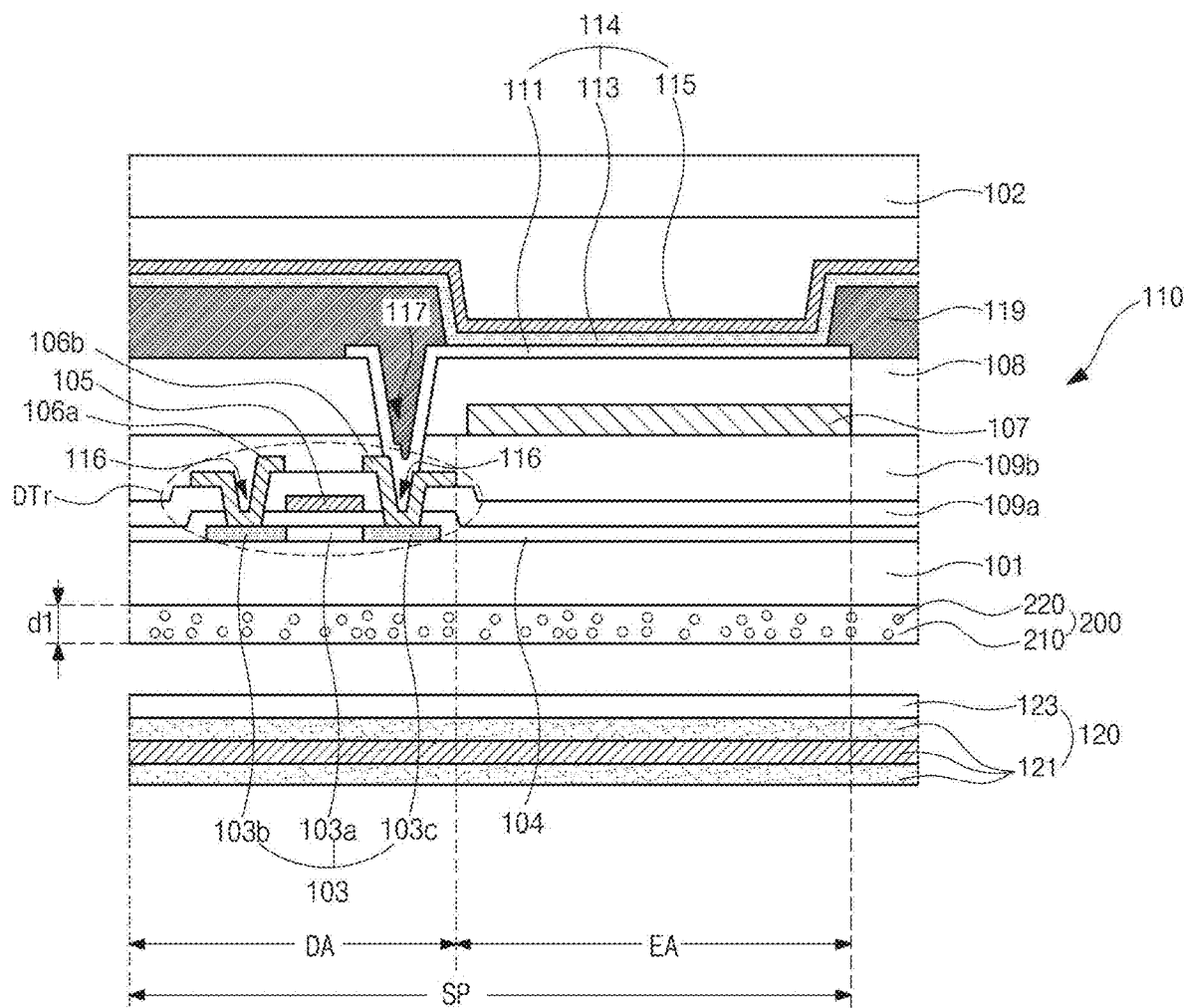
FIG. 3 is an enlarged cross-sectional view illustrating a portion of FIG. 2.

FIG. 2 is a schematic cross-sectional view illustrating an organic light-emitting diode (OLED) display according to a first embodiment of the present disclosure, and FIG. 3 is an enlarged cross-sectional view illustrating a portion of FIG. 2. All the components of the OLED displays according to all embodiments of the present disclosure are operatively coupled and configured.

Referring to FIG. 2, an OLED display device 100 according to the first embodiment of the present disclosure is classified into a top emission type or a bottom emission type according to a transmission direction of emitted light. Hereinafter, the bottom emission type will be described as an example in the present disclosure.

For convenience of description, a region, in which a driving thin film transistor DTr is formed, is defined as a non-emission area DA, and a region, in which a light-emitting diode 114 is formed, is defined as an emission area EA.

As shown in FIGS. 2 and 3, the OLED display device 100 according to the first embodiment of the present disclosure includes an OLED display panel 110 and a polarizer 120. In the OLED display panel 110, a substrate 101, on which the driving thin film transistor DTr and the light emitting diode 114 are formed, is encapsulated by an encapsulation substrate 102.

Here, more specifically describing the OLED display panel 110, a semiconductor layer 103 is disposed in the non-emission area DA of each pixel region SP on the substrate 101. The semiconductor layer 103 is made of silicon and includes an active region 103a as a channel and a source region 103b and a drain region 103c. The active region 103a is a central portion of the semiconductor layer 103, and the source region 103b and the drain region 103c are disposed on both side surfaces of the active region 103a. High concentration impurities are doped into the source region 103b and the drain region 103c.

A gate insulating layer 104 is disposed on the semiconductor layer 103.

Further, a gate electrode 105 and a gate line extending along a direction are provided on the gate insulating layer 104. The gate electrode 105 corresponds to the active region 103a of the semiconductor layer 103.

In addition, a first interlayer insulating layer 109a is disposed on the gate electrode 105 and the gate line. In this case, the first interlayer insulating layer 109a and the gate insulating layer 104 below the first interlayer insulating layer 109a have first and second semiconductor layer contact holes 116 respectively exposing the source and drain regions 103b and 103c at both side surfaces of the active region 103a.

Source and drain electrodes 106a and 106b, which are spaced from each other and respectively contact the source and drain regions 103b and 103c exposed through the first and second semiconductor layer contact holes 116, are provided on the first interlayer insulating layer 109a.

A second interlayer insulating layer 109b is disposed on the source and drain electrodes 106a and 106b and the first interlayer insulating layer 109a exposed between the source and drain electrodes 106a and 106b.

In this case, the source and drain electrodes 106a and 106b, the semiconductor layer 103 having the source and drain regions 103b and 103c in contact with the source and drain electrodes 106a and 106b, the gate insulating layer 104 disposed on the semiconductor layer 103, and the gate electrode 105 constitute the driving thin film transistor DTr.

Further data lines are provided to cross the gate lines and define the pixel regions SP. A switching thin film transistor having the same structure as the driving thin film transistor DTr and connected to the driving thin film transistor DTr is provided.

In FIG. 3, the driving thin film transistor DTr has a top gate type in which the semiconductor layer 103 can be formed as a polysilicon semiconductor layer or an oxide semiconductor layer. As a modified example, the switching thin film transistor and the driving thin film transistor DTr can have a bottom gate type in which the semiconductor layer 103 is made of intrinsic amorphous silicon and doped amorphous silicon.

The driving thin film transistor DTr can have a characteristic in which a threshold voltage thereof is shifted by light. To prevent this, a light shielding layer can be further provided below the semiconductor layer 103.

The light shielding layer is provided between the substrate 101 and the semiconductor layer 103 to block light incident on the semiconductor layer 103 through the substrate 101 and to minimize or prevent a change in the threshold voltage of the driving thin film transistor DTr, caused by ambient light (e.g., external light).

In addition, a wavelength conversion layer 107 is disposed on the second interlayer insulating layer 109b and corresponds to the emission area EA of each pixel region SP. The wavelength conversion layer 107 includes a color filter which transmits only a wavelength of a color set in the pixel region SP among white light emitted to the substrate 101 from the light emitting diode 114.

That is, the wavelength conversion layer 107 can transmit only a red, green, or blue wavelength. For example, one unit pixel can include adjacent first to third pixel regions SP. In this case, the wavelength conversion layer 107 provided in the first pixel region can include a red color filter, the wavelength conversion layer 107 provided in the second pixel region can include a green color filter, and the wavelength conversion layer 107 provided in the third pixel region can include a blue color filter.

In addition, one unit pixel can further include a white pixel in which the wavelength conversion layer 107 is not formed.

In another example, the wavelength conversion layer 107 can include quantum dots which have a size capable of emitting light with a color set in each pixel region SP according to white light emitted to the substrate 101 from the light emitting diode 114. For example, the quantum dots can be selected from quantum dots of CdS, CdSe, CdTe, ZnS, ZnSe, GaAs, GaP, GaAs—P, Ga—Sb, InAs, InP, InSb, AlAs, AlP, AlSb, and the like.

For example, the wavelength conversion layer 107 of the first pixel region can include quantum dots of CdSe or InP, the wavelength conversion layer 107 of the second pixel region can include quantum dots of CdZnSeS, and the wavelength conversion layer 107 of the third pixel region can include quantum dots of ZnSe. The OLED display device 100, in which the wavelength conversion layer 107 includes quantum dots, can have a high color gamut.

In another example, the wavelength conversion layer 107 can include a color filter containing quantum dots.

Since the pixel regions SP respectively emit a red color R, a green color G, a blue color B, and a white color W, the OLED display device 100 of the present disclosure implements a high brightness full-color display.

An overcoat layer 108 is disposed on the wavelength conversion layer 107. The overcoat layer 108 with the second interlayer insulating layer 109b has a drain contact hole 117 exposing the drain electrode 106b. A first electrode 111 is disposed on the overcoat layer 108 and is connected to the drain electrode 106b of the driving thin film transistor DTr through the drain contact hole 117. The first electrode 111 can include a material having a relatively high work function value to serve as an anode of the light emitting diode 114.

The first electrode 111 can be made of a metal oxide such as indium tin oxide (ITO) or indium zinc oxide (IZO), a mixture of a metal and an oxide such as ZnO:Al or $SnO_2$:Sb, or a conductive polymer such as poly(3-methylthiophene), poly[3,4-(ethylene-1,2-dioxy)thiophene] (PEDT), polypyrrole, or polyaniline. In addition, the first electrode 111 can be made of a carbon nano tube (CNT), graphene, a silver nano wire, or the like.

The first electrode 111 is disposed for each pixel region SP, and a bank 119 can be disposed between the first electrodes 111 disposed for each pixel region SP. That is, the first electrode 111 is separately disposed for each pixel region SP by the bank 119, which is disposed at a boundary portion of each pixel region SP.

An organic emitting layer 113 is disposed on the first electrode 111. The organic emitting layer 113 can include a single layer made of a light-emitting material. In order to improve luminous efficiency, the organic emitting layer 113 can include a multi-layered structure of a hole injection layer, a hole transport layer, an emitting material layer, an electron transport layer, and an electron injection layer.

A second electrode 115, which serves as a cathode, is disposed on an entire upper surface of the organic emitting layer 113.

The second electrode 115 can include a material having a relatively low work function value. In this case, the second electrode 115 can have a double-layered structure of a first metal such as Ag, which has a relatively low work function, and a second metal such as Mg or a single-layered structure of an alloy thereof.

In the OLED display panel 110, when a voltage is applied to the first electrode 111 and the second electrode 115 according to a selected signal, holes injected from the first electrode 111 and electrons injected from the second electrode 115 are transported to the organic emitting layer 113 to form excitons. When the excitons transit from an excited state to a ground state, light is generated and emitted in the form of visible light.

In this case, the emitted light passes through the transparent first electrode 111 and is emitted to the outside, so that the OLED display panel 110 can provide an image.

The encapsulation substrate 102 in the form of a thin film is formed above the driving thin film transistor DTr and the light emitting diode 114, so that the OLED display panel 110 is encapsulated by the encapsulation substrate 102.

In order to prevent external oxygen and moisture from permeating into the OLED display panel 110, the encapsulation substrate 102 can include at least two inorganic protective films. In this case, an organic protective film can be interposed between the two inorganic protective films to compensate for impact resistance of the inorganic protective films.

Since moisture and oxygen are prevented/minimized from permeating into side surfaces of the organic protective film in such a structure in which the organic protective film and the inorganic protective film are alternately and repeatedly stacked, it is preferable that the inorganic protective film completely covers the organic protective film.

Accordingly, the OLED display panel 110 can prevent (or minimize) moisture and oxygen from permeating into the OLED display panel 110 from the outside.

As a result, it is possible to prevent/minimize an electrode layer from being oxidized and corroded by oxygen and moisture introduced into the OLED display panel 110, thereby preventing/minimizing reductions in emission characteristics and lifespan of the organic emitting layer 113.

In addition, it is possible to prevent/minimize current leakage and a short circuit, thereby preventing pixel defects. As a result, non-uniformity characteristics of brightness or image are prevented from being generated.

The polarizer 120 is disposed on an outer surface of the substrate 101 in the OLED display panel 110, through which light passes, and is configured to prevent a reduction in contrast caused by ambient light.

For example, in the OLED display device 100, the polarizer 120 is provided to block ambient light, which is incident from the outside, in a transmission direction of light emitted through the organic emitting layer 113 when the OLED display panel 110 is in a driving mode for implementing an image, thereby improving contrast.

The polarizer 120 can be a circular polarizer configured to block ambient light and can include a phase difference plate 123 and a linear polarizer 121.

A surface treatment layer can be further provided outside the polarizer 120. The surface treatment layer can be an anti-glare layer including silica beads or a hard coating layer configured to prevent damage to a surface of the polarizer 120.

As a result, the OLED display device 100 can prevent a reduction in contrast by minimizing reflection of ambient light through the polarizer 120.

Meanwhile, since the substrate 101 is a thin glass substrate, the OLED display device 100 according to the first embodiment of the present disclosure is implemented as a light and thin OLED display device or as a flexible OLED display device capable of maintaining display performance despite being bent like paper.

In this case, a foamed polymer layer 200 is disposed outside the thin glass substrate 101.

The foamed polymer layer 200 has strong impact resistance characteristics and thus functions to improve impact resistance of the OLED display device 100.

More specifically, the foamed polymer layer 200 can include a polymer resin 210 having strong impact resistance. The polymer resin 210 can include, for example, one selected from polyimide, polyacrylate, polyethylene ether phthalate, polyethylene naphthalate, polycarbonate, polyarylate, polyetherimide, polyether sulfone, cellulose triacetate, poly(vinylidene chloride), poly(vinylidene fluoride), an ethylene-vinyl alcohol copolymer, and combinations thereof.

An air pocket (an air pore or a pore) 220 is provided inside the foamed polymer layer 200. The air pocket 220 functions to absorb and alleviate an impact applied from the outside.

That is, in the foamed polymer layer 200, the polymer resin 210 having the strong impact resistance primarily absorbs and alleviates the impact applied from the outside. In addition, the air pocket 220 provided inside the polymer resin 210 secondarily absorbs and alleviates the impact applied from the outside.

Therefore, in the OLED display device 100 according to the first embodiment of the present disclosure, although the substrate 101 is the thin glass substrate, the impact applied from the outside can be alleviated twice by the foamed polymer layer 200 disposed on the outer surface of the substrate 101, thereby improving impact resistance.

The air pocket 220 provided inside the foamed polymer layer 200 can perform a function of alleviating an impact as well as a function of scattering ambient light incident from the outside of the OLED display device 100 so that the air pocket 220 can also reduce the ambient light from being reflected toward a viewer.

Table 1 below shows experimental results of measuring impact resistance of the OLED display device 100 according to the first embodiment of the present disclosure.

TABLE 1

| Evaluation Condition | | OLED | |
|---|---|---|---|
| Weight | Number of Times | Sample 1 | Sample 2 |
| 100 g | 100 | No Crack | No Crack |
| 250 g | 100 | No Crack | No Crack |
| 500 g | 100 | Crack Generated | No Crack |
| 1 kg | 100 | Crack Generated | No Crack |

Prior to the description, Sample 1 indicates a conventional OLED display device, and Sample 2 indicates the OLED display device 100 according to the first embodiment of the present disclosure. In this case, the foamed polymer layer 200 of sample 2 has a thickness dl of 10 μm.

Here, an experiment was performed by applying an impact from the outside of a polarizer attached to an OLED display device and was performed by twice applying an impact 100 times to each of five points selected randomly.

Generation of cracks was checked for after applying an impact to an OLED display device and then leaving the OLED display device in a high temperature environment of 80° C. for 240 hours.

Referring to Table 1, it can be confirmed that cracks are generated in Sample 1 by an impact with a weight of 500 g or more. On the contrary, it can be confirmed that cracks are not even generated in Sample 2 by an impact with a weight of 1 kg.

This means that since the foamed polymer layer 200 is disposed on the outer surface of the substrate 101 in the OLED display device 100 according to the first embodiment of the present disclosure, impact resistance is improved and thus cracks are not generated by an impact applied from the outside.

That is, in the OLED display device 100 according to the first embodiment of the present disclosure, the impact applied from the outside can be alleviated twice by the foamed polymer layer 200 disposed on the outer surface of the substrate 101, thereby improving impact resistance.

Meanwhile, since the foamed polymer layer 200 is disposed on the outer surface of the substrate 101, through which light emitted from the light emitting diode 114 passes, it is preferable that the foamed polymer layer 200 be transparent so as to not affect light emitted from the light emitting diode 114.

More precisely, it is preferable that the foamed polymer layer 200 has a transmittance of about 89%±3%.

It is preferable that the foamed polymer layer 200 has the thickness dl of about 6 to 10 μm.

TABLE 2

| OLED | |
|---|---|
| Thickness (μm) of Foamed polymer layer | Sample 2 |
| 1 | Crack Generated |
| 5 | Crack Generated |
| 10 | No Crack |
| 15 | No Crack |

Table 2 shows experimental results of measuring whether cracks are generated according to the thickness dl of the foamed polymer layer 200 in the OLED display device 100 according to the first embodiment of the present disclosure.

An experiment was performed by applying an impact from the outside of the polarizer 120 attached to the OLED display device 100 according to the first embodiment of the present disclosure and was performed by twice applying an impact 100 times with a weight of 500 g to each of five points selected randomly. Generation of cracks was checked for after applying an impact to the OLED display device 100, and then, leaving the OLED display device 100 for 240 hours in a high temperature environment of 80° C.

Referring to Table 2, it can be confirmed that when the foamed polymer layer 200 has a thickness of 1 μm to 5 μm, cracks are generated, and when the thickness dl of the foamed polymer layer 200 is 10 μm or more, cracks are not generated.

Here, since impact resistance is improved as the thickness dl of the foamed polymer layer 200 is increased, it is preferable that the thickness dl of the foamed polymer layer 200 is greater than about 5 μm.

However, when the foamed polymer layer 200 is too thick, a total thickness of the OLED display device 100 is increased. In addition, even though the foamed polymer layer 200 is transparent, brightness of the OLED display device 100 itself can be reduced by an inherent haze characteristic implemented by the foamed polymer layer 200.

Figure 4A:
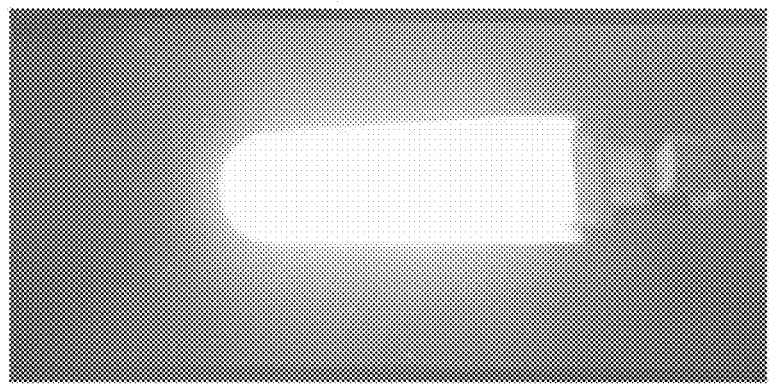
FIGS. 4A and 4B are images showing a haze characteristic according to a thickness of a foamed polymer layer.

FIG. 4A is an image showing a haze characteristic of a foamed polymer layer having a thickness of 15 μm. It can be confirmed that light of a light source disposed below the foamed polymer layer is obscured and blurred.

Figure 4B:
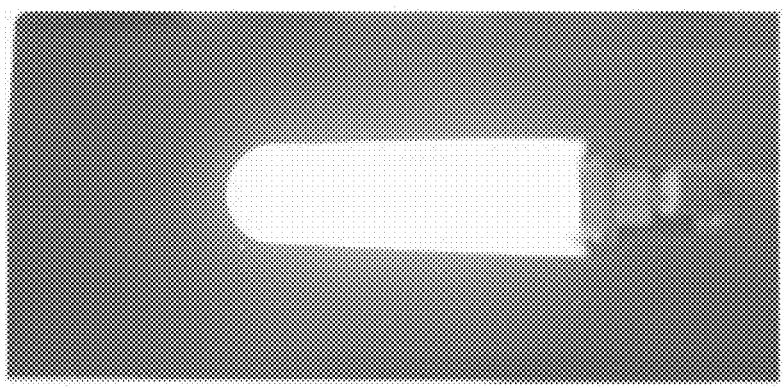

Meanwhile, FIG. 4B is an image showing a haze characteristic of a foamed polymer layer having a thickness of 10 μm. It can be confirmed that light of a light source disposed below the foamed polymer layer is clear, and particularly, is clearer as compared with FIG. 4A.

Therefore, it is preferable that the foamed polymer layer 200 has the thickness of 10 μm or less so as to not affect brightness of the OLED display device 100.

That is, it is preferable that the foamed polymer layer 200 disposed outside the substrate 101 in the OLED display device 100 according to the first embodiment of the present disclosure has the thickness dl of about 6 µm to about 10 µm so as to improve impact resistance of the OLED display device 100 but not affect brightness of the OLED display device 100. The thickness of the foamed polymer layer 200 can be smaller than that of the substrate 101 and that of the polarizer 120.

In this case, the foamed polymer layer 200 having the thickness dl of 6 µm to 10 µm preferably has a haze characteristic of 10% or less, and more preferably has a haze characteristic of 5% or less.

Therefore, the foamed polymer layer 200 implements a transmittance of about 89%±3%.

It is preferable that a refractive index of the foamed polymer layer 200 is similar to a refractive index of the substrate 101. As the refractive index of the foamed polymer layer 200 disposed outside the substrate 101 becomes more similar to the refractive index of the substrate 101, it is possible to minimize reflection of light caused by a refractive index difference, thereby minimizing loss of light emitted from the OLED display device 100 as well as a reduction in contrast caused by light reflected by the refractive index difference.

As described above, in the OLED display device 100 according to the first embodiment of the present disclosure, an impact applied from the outside can be alleviated twice by the foamed polymer layer 200 disposed on the outer surface of the substrate 101, thereby improving impact resistance.

The air pocket 220 provided inside the foamed polymer layer 200 can perform a function of alleviating an impact as well as a function of scattering ambient light incident from the outside of the OLED display device 100 so that the air pocket 220 can also reduce the ambient light from being reflected toward a viewer.

Therefore, it is possible to further prevent a reduction in contrast caused by the ambient light.

Meanwhile, in the foamed polymer layer 200, a polymer resin 210 is applied on the outer surface of the substrate 101 through spin coating, dip coating, bar coating, or the like, and then, an annealing process is performed on the polymer resin 210 in a high temperature atmosphere of 200° C. to 250° C. to form the air pocket 220 inside the polymer resin 210.

In this case, the annealing process of the polymer resin 210 can be performed along with a high temperature aging process performed for device stabilization of the OLED display device 100 itself so that it is not necessary to perform a separate process of forming the air pockets 220 inside the foamed polymer layer 200.

Second Embodiment

Figure 5:
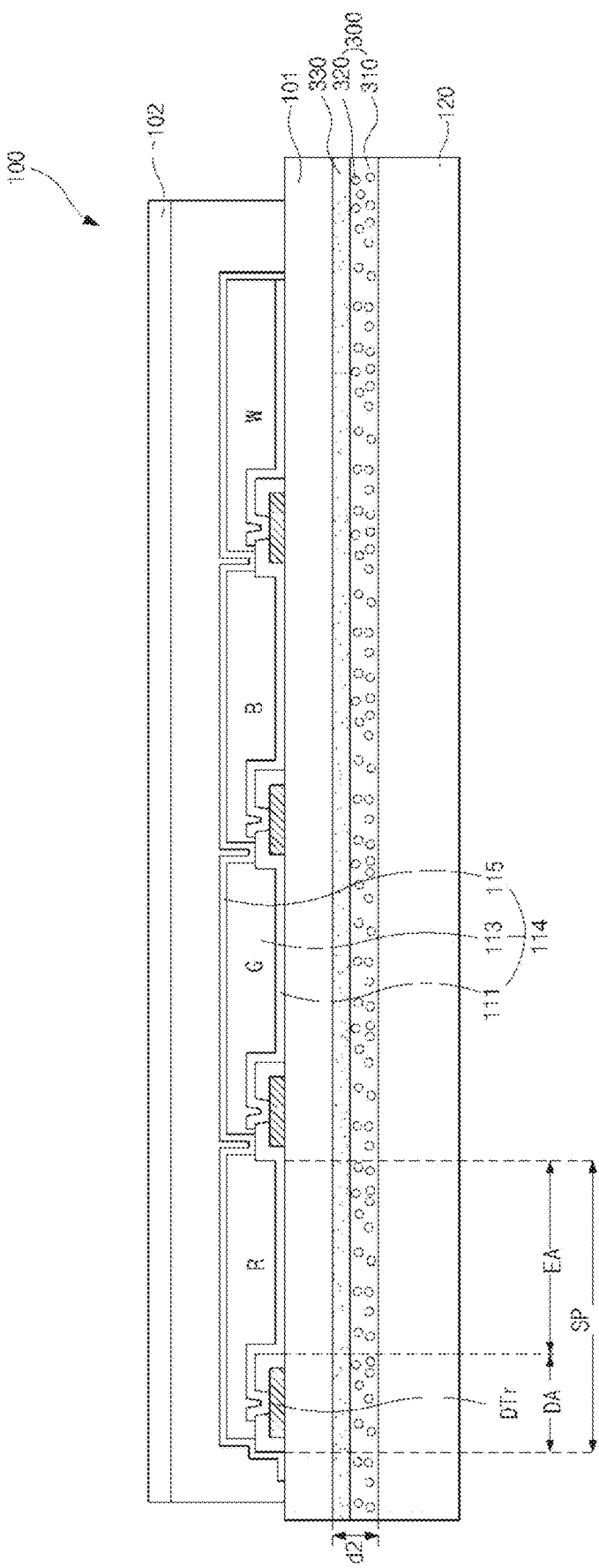
FIG. 5 is a schematic cross-sectional view illustrating an OLED display device according to a second embodiment of the present disclosure.

FIG. 5 is a schematic cross-sectional view illustrating an OLED display device according to a second embodiment of the present disclosure.

Meanwhile, the same (or similar) reference numbers as in the first embodiment can be used to refer to the same parts to avoid a repeated description, and the characteristic points of the second embodiment will be described only or will be focused Referring to FIG. 5, the OLED display device 100 according to the second embodiment of the present disclosure is mainly divided into an OLED display panel 110 and a polarizer 120. In the OLED display panel 110, a substrate 101, on which a driving thin film transistor DTr and an LED 114 are formed, is encapsulated by an encapsulation substrate 102.

Here, the OLED display panel 110 can have a structure as shown in FIG. 3.

In this case, the substrate 101 can be made of a plastic material, and thus, the OLED display device 100 according to the second embodiment of the present disclosure can be implemented as a light weight and thin OLED display device or as a flexible OLED display device capable of maintaining display performance despite being bent like paper.

On the other hand, when the plastic material is used as the substrate 101, polyimide having high heat resistance, which is able to withstand high temperature, can be used, considering that a high temperature deposition process is performed on the substrate 101. A buffer layer can be further provided on a front surface of the substrate 101.

The buffer layer functions to prevent a material contained in the substrate 101 from being diffused into a driving thin film transistor DTr and a switching thin film transistor during a high temperature process of a manufacturing process of the driving thin film transistor DTr and the switching thin film transistor.

In addition, the buffer layer can function to prevent external water or moisture from permeating into the LED 114. The buffer layer can be made of silicon oxide or silicon nitride.

In this case, a foamed polymer layer 300 is attached outside the substrate 101 made of the plastic material. The foamed polymer layer 300 may have a form of a film.

The foamed polymer layer 300 has strong impact resistance characteristics and thus functions to improve impact resistance of the OLED display device 100.

More specifically, the foamed polymer layer 300 can include a polymer resin 310 having strong impact resistance. The polymer resin 310 can include one selected from polyimide, polyacrylate, polyethylene ether phthalate, polyethylene naphthalate, polycarbonate, polyarylate, polyetherimide, polyether sulfone, cellulose triacetate, poly(vinylidene chloride), poly(vinylidene fluoride), an ethylene-vinyl alcohol copolymer, and combinations thereof.

An air pocket 320 is provided inside the foamed polymer layer 300. The air pocket 320 functions to absorb and alleviate an impact applied from the outside.

For example, in the foamed polymer layer 300, the polymer resin 310 having the strong impact resistance primarily absorbs and alleviates the impact applied from the outside. In addition, the air pocket 320 provided inside the polymer resin 310 secondarily absorbs and alleviates the impact applied from the outside.

Therefore, in the OLED display device 100 according to the second embodiment of the present disclosure, the impact applied from the outside can be alleviated twice by the foamed polymer layer 300 attached to an outer surface of the substrate 101, thereby improving impact resistance.

The air pocket 320 provided inside the foamed polymer layer 300 can perform a function of alleviating an impact as well as a function of scattering ambient light incident from the outside of the OLED display device 100 so that the air pocket 320 can also reduce the ambient light from being reflected toward a viewer.

In this case, in the OLED display device 100 according to the second embodiment of the present disclosure, since the substrate 101, to which the foamed polymer layer 300 is attached, is made of the plastic material, it is difficult to directly apply a polymer resin 310 film on the outer surface of the substrate 101 and to perform an annealing process on the polymer resin 310 film. Thus, it is preferable that the foamed polymer layer 300 having the air pocket 320 therein is attached outside the substrate 101 by using an adhesive layer 330.

The adhesive layer 330 is made of a transparent material. It is preferable that both of the foamed polymer layer 300 and the adhesive layer 330 have a transmittance of about 89%±3%.

It is preferable that the foamed polymer layer 300 and the adhesive layer 330 have a total thickness D2 of 6 μm to 10 μM so as to improve impact resistance of the OLED display device 100 but not affect brightness of the OLED display device 100.

It is preferable that both of refractive indexes of the foamed polymer layer 300 and the adhesive layer 330 are similar to a refractive index of the substrate 101 such that reflection of light, caused by a refractive index difference between the foamed polymer layer 300 and the adhesive layer 330, and the substrate 101, is minimized.

As described above, in the OLED display device 100 according to the second embodiment of the present disclosure, an impact applied from the outside can be alleviated twice by the foamed polymer layer 300 attached to the outer surface of the substrate 101 through adhesive layer 330, thereby improving impact resistance.

The air pocket 320 provided inside the foamed polymer layer 300 can perform a function of alleviating an impact as well as a function of scattering ambient light incident from the outside of the OLED display device 100 so that the air pocket 320 can also reduce the ambient light from being reflected toward a viewer.

Therefore, it is possible to further prevent a reduction in contrast caused by the ambient light.

As described above, according to the present disclosure, since a foamed polymer layer having an air pocket inside a polymer resin is disposed on an outer surface of a substrate in an OLED display device, an impact applied from the outside can be alleviated twice, thereby improving impact resistance.

The air pocket provided inside the foamed polymer layer can perform a function of alleviating an impact as well as a function of scattering ambient light incident from the outside of the OLED display device so that the air pocket can also prevent a reduction in contrast caused by the ambient light.

In FIGS. 3 and 5, the air pocket 220 or 320 is uniformly distributed in the foamed polymer layer. Alternatively, the air pocket 320 has a first density in the red, green and blue pixel regions and a second density, which is greater than the first density, in the white pixel region.

Since there is no wavelength conversion layer, e.g., the color filter, in the white pixel region, the ambient light reflection in the white pixel region is higher than that in each of the red, green and blue pixel regions. Accordingly, by increasing the density of the air pocket 320 in the white pixel region, the ambient light is further scattered by the air pocket 320 such that the ambient light reflection is advantageously reduced.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. An organic light-emitting diode display device, comprising:
   a substrate;
   a light-emitting diode including a first electrode, an organic emitting layer and a second electrode, and disposed on a first side of the substrate; and
   a foamed polymer layer disposed on a second side of the substrate and including a polymer resin and an air pocket inside the polymer resin,
   wherein the organic light-emitting diode display device includes a red pixel region, a green pixel region, a blue pixel region and a white pixel region,
   wherein the air pocket has a first density in at least one of the red pixel region, the green pixel region, or the blue pixel region, and
   wherein the air pocket has a second density in the white pixel region, and the second density is greater than the first density.

2. The organic light-emitting diode display device of claim 1, wherein the polymer resin includes one selected from polyimide, polyacrylate, polyethylene ether phthalate, polyethylene naphthalate, polycarbonate, polyarylate, polyetherimide, polyether sulfone, cellulose triacetate, poly (vinylidene chloride), poly(vinylidene fluoride), an ethylene-vinyl alcohol copolymer, and combinations thereof.

3. The organic light-emitting diode display device of claim 1, wherein the foamed polymer layer has a transmittance of about 89%±3%.

4. The organic light-emitting diode display device of claim 1, wherein the foamed polymer layer has a thickness of about 6 μm to about 10 μm.

5. The organic light-emitting diode display device of claim 1, wherein the foamed polymer layer has a form of a film, and an adhesive layer is interposed between the foamed polymer layer and the substrate.

6. The organic light-emitting diode display device of claim 5, wherein the foamed polymer layer and the adhesive layer have a transmittance of about 89%±3%.

7. The organic light-emitting diode display device of claim 5, wherein the foamed polymer layer and the adhesive layer have a thickness of about 6 μm to about 10 μm.

8. The organic light-emitting diode display device of claim 1, further comprising a polarizer is disposed outside the foamed polymer layer.

9. The organic light-emitting diode display device of claim 8, wherein a thickness of the foamed polymer layer is smaller than a thickness of the polarizer.

10. The organic light-emitting diode display device of claim 1, wherein the air pocket has the first density in the red pixel region, the green pixel region and the blue pixel region.

11. The organic light-emitting diode display device of claim 1, wherein a refractive index of the foamed polymer layer is same as a refractive index of the substrate.

12. The organic light-emitting diode display device of claim 1, wherein the organic light-emitting diode display device further comprises a red color filter in the red pixel region, a green color filter in the green pixel region, and a blue color filter in the blue pixel region.

13. An organic light-emitting diode display device, comprising:
   a substrate;
   a light-emitting diode including a first electrode, an organic emitting layer and a second electrode, and disposed on a first side of the substrate; and
   a foamed polymer layer disposed on a second side of the substrate and including a polymer resin and an air pocket inside the polymer resin, wherein the organic light-emitting diode display device includes a red pixel region, a green pixel region and a blue pixel region and a white pixel region, wherein the organic light-emitting diode display device further comprises a red color filter in the red pixel region, and wherein the air pocked has a first density in the red pixel region and a second density in the white pixel region, and the second density is greater than the first density.

\* \* \* \* \*